(12) United States Patent
Schmid et al.

(10) Patent No.: US 8,048,208 B2
(45) Date of Patent: Nov. 1, 2011

(54) METHOD AND APPARATUS FOR DEPOSITING CHALCOGENS

(75) Inventors: Dieter Schmid, Reutlingen (DE);
Hans-Peter Voelk, Griesingen (DE);
Robert Michael Hartung, Blaubeuren (DE)

(73) Assignee: Centrotherm Photovoltaics AG, Blaubeuren (DE)

( * ) Notice: Subject to any disclaimer, the term of this patent is extended or adjusted under 35 U.S.C. 154(b) by 504 days.

(21) Appl. No.: 12/208,436

(22) Filed: Sep. 11, 2008

(65) Prior Publication Data

US 2009/0120286 A1 May 14, 2009

(30) Foreign Application Priority Data

Sep. 11, 2007 (DE) .................... 10 2007 043 049

(51) Int. Cl.
*B01D 5/00* (2006.01)
(52) U.S. Cl. ................ 95/290; 55/430; 55/466; 62/601; 62/55.5
(58) Field of Classification Search .............. 95/39, 288, 95/290; 96/221; 118/715; 55/242, 267, 55/431, 430, 466; 62/601, 55.5
See application file for complete search history.

(56) References Cited

U.S. PATENT DOCUMENTS

| | | | | |
|---|---|---|---|---|
| 2,786,609 A * | 3/1957 | Isserlis | ............................ | 222/227 |
| 3,537,912 A * | 11/1970 | Aven et al. | ..................... | 117/106 |
| 4,174,750 A | 11/1979 | Nichols | | |
| 4,555,389 A * | 11/1985 | Soneta et al. | .................. | 423/210 |
| 5,183,646 A * | 2/1993 | Anderson et al. | ............. | 423/210 |
| 5,738,699 A * | 4/1998 | Hu et al. | .......................... | 96/228 |
| 5,785,929 A * | 7/1998 | Kim et al. | ....................... | 422/171 |
| 5,832,843 A * | 11/1998 | Park et al. | ...................... | 110/214 |
| 6,090,208 A * | 7/2000 | Han | ............................... | 118/715 |
| 6,627,162 B1 * | 9/2003 | Chen | .............................. | 422/173 |
| 6,638,343 B1 * | 10/2003 | Kawamura et al. | ............. | 95/218 |
| 6,645,302 B2 * | 11/2003 | Udagawa | ....................... | 118/715 |
| 7,022,298 B2 * | 4/2006 | Hasegawa | ...................... | 423/210 |
| 7,488,374 B2 * | 2/2009 | Komatsu | .......................... | 95/288 |
| 2003/0217763 A1 | 11/2003 | Chang et al. | | |
| 2004/0081607 A1 | 4/2004 | Hasegawa | | |
| 2006/0144234 A1 | 7/2006 | Komatsu | | |

FOREIGN PATENT DOCUMENTS

| | | |
|---|---|---|
| EP | 0 289 858 A1 | 11/1988 |
| EP | 0289858 * | 11/1988 |
| EP | 1 531 189 A1 | 5/2005 |
| EP | 1531189 A1 * | 5/2005 |
| GB | 1 123 741 A | 2/1966 |

* cited by examiner

*Primary Examiner* — Duane Smith
*Assistant Examiner* — Ives Wu
(74) *Attorney, Agent, or Firm* — Heslin Rothenberg Farley & Mesiti P.C.

(57) ABSTRACT

A method and device for separation of chalcogens from waste gases in process installations are provided so that complete and reliable removal of chalcogens occurs continuously during nonstop operation of the process installation in the most effective manner possible. The process installation is connected via a pipeline to an input connector of the device for separation of chalcogens arranged outside of the process installation. The pipeline and the input connector have a heat connection to the process chamber. The device for separation of chalcogens is provided with an outlet connector as well as a gas outlet is equipped with a cooling device so that the input connector is excluded from cooling.

24 Claims, 2 Drawing Sheets

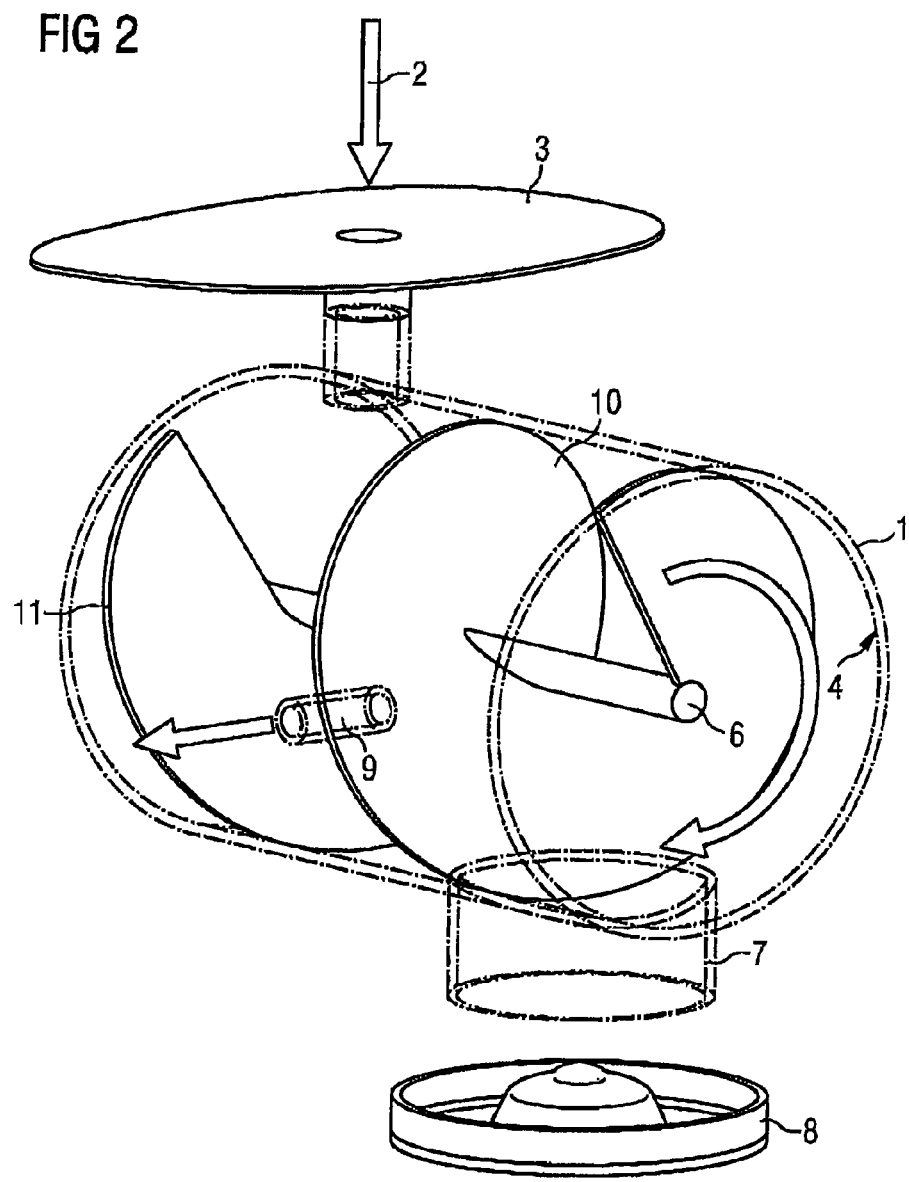

METHOD AND APPARATUS FOR DEPOSITING CHALCOGENS

CROSS REFERENCE TO RELATED APPLICATIONS

Figure 1:
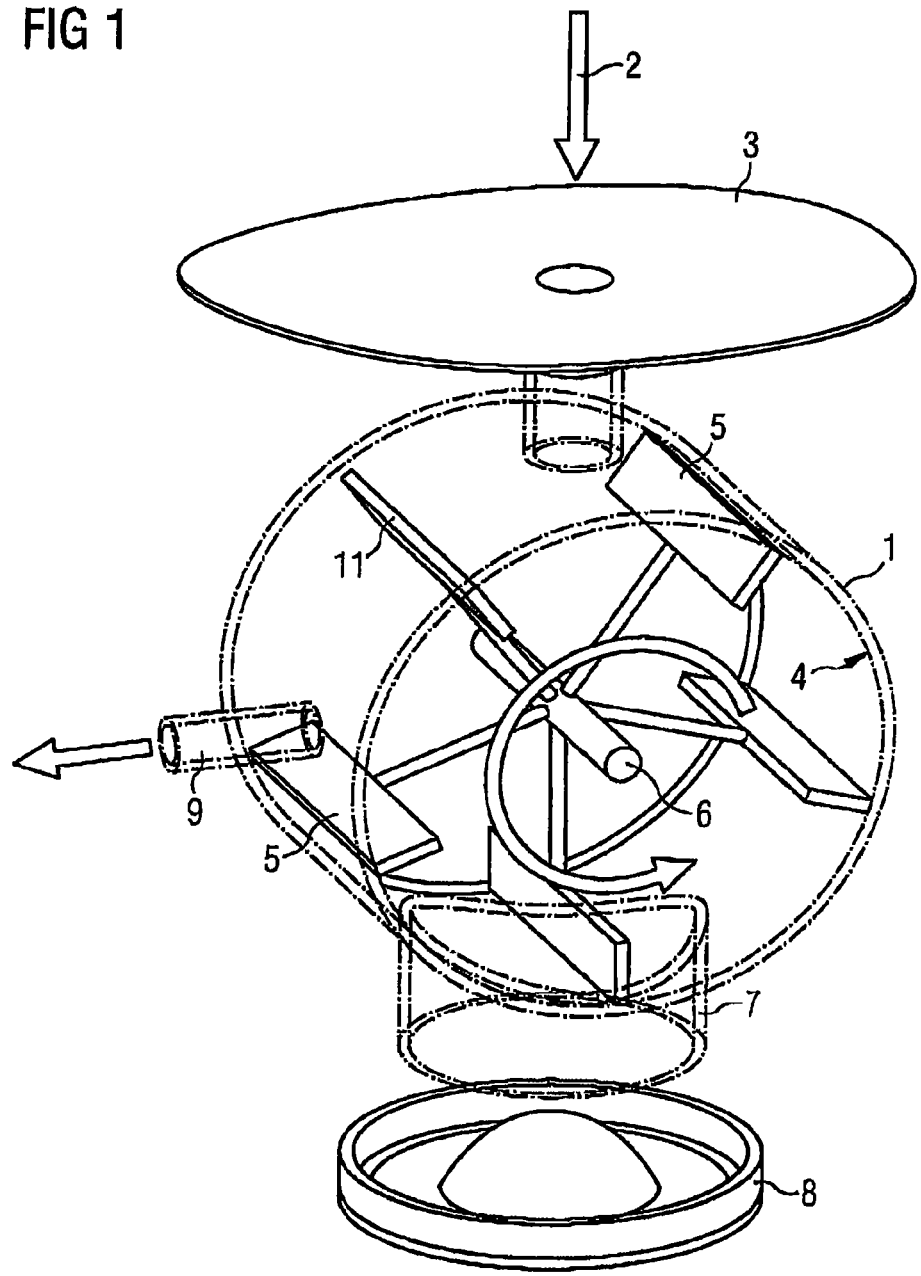

This application claims priority of German Application No. 10 2007 043 049.5 filed on Sep. 11, 2007, the entire disclosure of this application being hereby incorporated herein by reference.

BACKGROUND ART

The invention concerns a method for separation of chalcogens from waste gases at process installations, as well as a device for separation of chalcogens that form during industrial processes in process installations in the gaseous state.

Sulfur, selenium, tellurium and their chemical compounds with each other or other substances, or their mixtures are generally referred to as chalcogens and have a solid state of aggregation at room temperature around 20° C. The chalcogens can be used as process substances for conversion of metallic layers, so-called precursor layers, for example, on silicon or glass substrates, to a compound semiconductor layer.

Conversion or transformation of metallic precursor layers containing copper/gallium and indium by chalcogens to a compound semiconductor layer ordinarily occurs at high temperatures in a process installation for thermal processes, for example, tempering or muffle furnace. Typical conversion temperatures lie at 500° C. to 600° C. The conversion temperature is then so high that chalcogens present in the solid state of aggregation at room temperature assume a vaporous or gaseous state of aggregation within the process installation.

Chalcogen in excess is generally required for conversion/transformation of the precursor layer to a semiconducting compound semiconductor layer. Part of the vaporous chalcogen reacts with the metal atoms of the precursor layer to a semiconducting compound semiconductor layer. Another part of the chalcogen is released in the gaseous state or as vapor, like selenium vapor, and must be completely removed from the process installation, including the waste gas installations or pipelines, as well as from the waste gases leaving the process installation.

Temperatures from 400° C. to 600° C. generally prevail in process installations for production of semiconducting layers from compound semiconductors that contain copper, gallium, indium and selenium and/or sulfur. Metallic layers, which can contain copper, gallium and indium, are converted at these temperatures together with sulfur, selenium or tellurium, their chemical compounds with each other or with other substances or their mixtures, i.e., the chalcogen, to semiconducting layers. The chalcogen assumes the gaseous state of aggregation under the process conditions, i.e., the stipulated temperature and stipulated pressure and is introduced in excess to the thermal process installation used for conversion.

Part of the chalcogen reacts with the metallic layers to semiconducting compounds in semiconductor layers. Another part of the chalcogen is released in the process installation and must be removed from it. Typically the excess chalcogen, containing selenium, sulfur, tellurium and other substances condenses in or on cooler installation parts—generally at undesired locations—forming fixed deposits there that must be removed with effort from the process installation in the context of maintenance work.

Removal of deposits can occur by opening the process installation and mechanical or chemical removal. However, this is much too costly for industrial processes and therefore not an appropriate means to eliminate deposits, especially since the process in the process installation must be interrupted each time for this purpose.

Long shutdown times in process installations are the result. At the now common installation sizes a few kilograms of sulfur, selenium and/or tellurium are formed typically per process day. These are significant amounts of deposits that adversely affect functioning of the process installation. The deposits must therefore be continuously removed as effectively as possible from the process installation during its continuous operation.

Cooled separation plates for defined deposition of the excess chalcogens in the process installations, like tempering furnaces have thus far been used. These separation plates are arranged here in the gas stream, i.e., in the active part of the tempering furnace, and must be removed from time to time from the processing installation and replaced by clean separation plates. Defined cooling of the separation plates, as well as simple and effective replacement of the plates for maintenance purposes are problems in this case. Maintenance of such an installation part is therefore very time-consuming and laborious and leads to long shutdown times. Apart from this, the chalcogens cannot be completely eliminated from the waste gases in this way.

BRIEF SUMMARY OF THE INVENTION

The underlying task of the invention is thus to devise a method and apparatus for separation of chalcogens from waste gases in processing installations so that complete, non-hazardous and safe removal of chalcogens is made possible continuously during nonstop operation of the process installation in the most effective manner possible.

The task underlying the invention is solved according to the process in that the process gases mixed with a carrier gas are fed to a device for separation of chalcogens by condensation from the process installation via installation components, like pipelines under largely isothermal conditions at a temperature above the condensation point, in which a temperature below the condensation temperature is maintained for separation of the chalcogens from the process gases.

The installation components carrying the process waste gases are then operated at a temperature between 200° C. and 600° C., i.e., depending on the design of the installation, the preferred temperatures are 350° C. in Se coating and 550° C. during treatment of substrates with Se vapor in a muffle furnace. On the other hand, the temperature in the device for separation of chalcogens is controlled to the lowest possible temperature below the condensation point of the chalcogens.

The temperature in the installation is preferably kept at room temperature for separation of chalcogens.

The task underlying the invention is also solved with a device for separation of chalcogens, in that the process installation is connected via a pipeline with an input connector to a device for separation of chalcogens arranged outside of it, in which the pipeline and the input connector have a heat connection to the process chamber and/or are provided with a heating device and in which the installation for separation of chalcogens provided with an outlet connector and a gas outlet is equipped with a cooling device so that the input connector is excluded from cooling.

In one embodiment of the invention heat insulation is arranged between the input connector and the installation for separation of the chalcogens. The input connector and the pipeline to the process installation can also be provided with heat insulation.

In an alternative the input connector and the pipeline to the process installation can be provided with a heating device in the form of an electric heater.

In order to achieve a subsequent cooling effect, the installation for separation of chalcogens can be equipped with water cooling.

To increase the effectiveness a special embodiment of the invention is characterized by the fact that the installation for separation of chalcogens is provided with an internal cleaning device.

The installation for separation of chalcogens has a cylindrical housing to accommodate the cleaning device, in which the input connector is arranged on top of the housing and the outlet connector on the bottom of the housing.

In a first embodiment brushes and/or scrapers are arranged in the housing as a cleaning device, which are attached to a rotational axis that lies in the axis of symmetry of the cylinder, the ends of the brushes or scrapers touching the inside wall of the housing.

The brushes and/or scrapers are preferably uncooled in order to avoid undesired deposits as much as possible.

A second embodiment is characterized by the fact that a screw with the shape of an Archimedes spiral with a cutting edge is inserted into the cylindrical housing, whose rotational axis also lies in the axis of symmetry of the housing, the input connector being arranged on the top on one end of the screw and the outlet connector on the bottom on the other end of the screw, in which the cutting edge extends to the inside wall of the housing.

The screw is preferably uncooled in order to avoid undesired deposits as much as possible.

The axes of symmetry of the cylindrical housing are preferably aligned horizontally.

In the interest of sufficient smooth running the brushes and/or scrapers or the screw are arranged with slight play in the housing.

The central idea for solution to the problem consists of appropriate guiding of the process gases with the chalcogens contained in them at sufficiently high temperatures together with a carrier gas, which can be nitrogen, for example, within the process installation, for example, a tempering furnace, to bring them to a defined device that is situated at a defined low temperature far below the condensation temperature. It is important here that all installation parts that carry gas are at sufficiently high temperature so that, if possible, no chalcogens can precipitate within these installation parts.

The device for defined separation of selenium, sulfur, tellurium kept at a defined low temperature is referred to as a chalcogen trap. The chalcogen trap is then part of the system carrying gas and is situated during operation of the tempering furnace at a defined low temperature. The parts carrying gas in the installation then remain free of undesired precipitates of selenium, sulfur, tellurium, etc., and the maintenance cycles of the process installation with a tempering furnace are lengthened accordingly. The productivity of a tempering furnace equipped with such a chalcogen trap is therefore much higher than usual.

The chalcogen trap is not situated in the active part of the tempering furnace but outside of it and is continuously freed of precipitates during nonstop operation by a brush or blade revolving along the inside wall of the chalcogen trap, in which the deposits are released from the inside wall and collected in a simple collection vessel, which must be emptied from time to time without interfering with the upstream process.

Advantages of the present solution to the problem lie in extremely reduced maintenance costs as well as avoidance of replacement of machine parts. The chalcogen trap cleans itself using revolving brushes or blades so that removal of excess chalcogen does not lead to downtimes of the tempering furnace. Productivity and available operating time (uptime) of a tempering furnace with a chalcogen trap are much higher than those of comparable installations with ordinary cooling plates.

BRIEF DESCRIPTION OF THE DRAWING FIGURES

The invention will be further explained below on a practical example. In the drawing:

FIG. 1 shows a chalcogen trap with revolving brushes or blades for removal of deposits; and FIG. 2 shows a chalcogen trap with a screw for removal of deposits.

DETAILED DESCRIPTION

The device for separation of chalcogens according to the invention, also referred to as a chalcogen trap, consists of a cooled cylinder 1, which is traversed by process gas 2 coming from a tempering furnace (not shown) (FIG. 1). Process gas 2 contains vaporous chalcogens as well as an inert carrier gas. This inert carrier gas can be nitrogen. During feed of the chalcogen vapor/carrier gas mixture it must be ensured that its temperature is kept well above the evaporation temperature of the chalcogen up to introduction into the cylinder 1 in each case.

The cylinder 1, on the other hand, is kept at a temperature that lies well below 400° C., for example at room temperature around 20° C. The input connector 3 situated in cylinder 1, however, is kept at a high temperature above the evaporation temperature of the chalcogens so that condensation of sulfur and/or selenium can occur here. As soon as the process gas 2 cools down by encountering the cooled walls 4 of the cylinder 1 of the chalcogen trap, it will condense or deposit there.

For removal of deposits on the cooled wall 4 of the cylinder 1 rotating brushes or blades 5 with cutting edges 11 in the cylinder are provided, the axis of rotation 6 of the brushes or blades 5 being situated in the axis of symmetry of the cylinder 1. With the brushes or cutting edges 11 of the blades 5 the precipitates on the inside wall 4 of the cylinder 1, i.e., the condensed chalcogens, are immediately removed mechanically. The loosened condensate then falls through a lower opening connector 7 in cylinder 1 into an appropriate container 8 easily replaceable via quick closures. The brushes or blades 5 are not cooled so that undesired deposits on them can largely be avoided.

In order to guarantee sufficient ease of running, the cutting edges 11 of the blades are set at a minimal distance to the inside wall 4 so that they do not or only slightly abrade or scrape its surface. During use of optional additional brushes these can be set so that they slightly abrade the wall 4.

The process gas now free of chalcogen flows through a waste gas connector 9 situated on the wall 4 from cylinder 1 into a waste gas installation (not shown). To intensify flow, a Laval nozzle can be inserted in the waste gas connector. Cooling of the cylinder 1 can occur by means of cooling water, which is supplied by appropriate cooling channels in or on the outside wall of the cylinder.

Another variant of the invention is shown in FIG. 2. Here the rotating blades or rotating brushes are replaced by a screw 10 in the form of an Archimedes spiral whose axis of rotation 6 also lies in the axis of symmetry of the cylinder. The outside edge of the screw 10 serves here as cutting edge 11 and should therefore scrape slightly against the inside wall of the cylinder or have only minimal distance from the inside wall. The screw 10 is also uncooled so that undesired deposits on it can be avoided as much as possible. The cutting edge removes the condensed selenium and/or condensed sulfur from the inside wall 4 of the cylinder 1 and conveys the removed material to a lower opening connector 7 in the cylinder 1, which then falls through it into an appropriate container 8.

The drawing shows the chalcogen trap in the installed position, i.e., the hot installation parts (input connector) with a temperature well above 400° C. are situated at the top of the drawing. The other installation parts (cylinder 4, etc.) are situated in the drawing underneath at a lower temperature (for example, room temperature).

The invention claimed is:

1. Method for separation of chalcogens from process waste gases of a process installation comprising: mixing and passing the process waste gases with a carrier gas from the process installation through installation components and/or pipelines under largely isothermal conditions at a temperature above condensation temperature of the chalcogens to a device for separation of the chalcogens, and separating the chalcogens by condensation on an inside wall of a cylindrical housing of the separation device, wherein a temperature below the condensation temperature is maintained in said separation device for separation of the chalcogens from the process waste gases, and wherein chalcogens, condensed on the inside wall of the cylindrical housing, are removed via a cutting edge of an internal cleaning device, accommodated in the cylindrical housing of the device for separation of the chalcogens, and the internal cleaning device comprises a screw with a shape of an Archimedes spiral.

2. Method according to claim 1, wherein the installation components carrying process waste gases are kept at a temperature between 400° C. and 600° C. above the condensation temperature of the chalcogens.

3. Method according to claim 1, wherein the temperature in the device for separation of chalcogens is controlled to a temperature below the condensation temperature of the chalcogens.

4. Method according to claim 3, wherein the temperature in the installation for separation of chalcogens is kept at room temperature.

5. Device for separation of chalcogens from process waste gases from a process installation wherein the process installation is connected via a pipeline to an input connector of a device for separation of chalcogens arranged outside of the installation, the pipeline and the input connector have a heat connection to a process chamber of the process installation and/or a heating device, and the device for separation of chalcogens has an outlet connector and a gas outlet equipped with a cooling device so that the input connector is excluded from cooling, wherein the device for separation of chalcogens includes an internal cleaning device and has a cylindrical housing to accommodate the cleaning device, and wherein an axis of symmetry of the cylindrical housing is aligned horizontally, and wherein brushes and/or scrapers are arranged in the housing as the cleaning device.

6. Device according to claim 5, wherein heat insulation is arranged between the input connector and the device for separation of chalcogens.

7. Device according to claim 5, wherein the input connector and the pipeline are provided with heat insulation.

8. Device according to claim 5, wherein the heating device comprises an electrical heater.

9. Device according to claim 5, wherein the device for separation of chalcogens is provided with water cooling.

10. Device according to claim 5, wherein the input connector is arranged on top and the outlet connector on bottom of the housing.

11. Device according to claim 5, wherein the brushes and/or scrapers are fastened to an axis of rotation lying on an axis of symmetry of the housing, ends of the brushes or scrapers touching an inside wall of the housing.

12. Device according to claim 5, wherein the brushes and/or scrapers are uncooled.

13. Device for separation of chalcogens from process waste gases from a process installation wherein the process installation is connected via a pipeline to an input connector of a device for separation of chalcogens arranged outside of the installation, the pipeline and the input connector have a heat connection to a process chamber of the process installation and/or a heating device, and the device for separation of chalcogens has an outlet connector and a gas outlet equipped with a cooling device so that the input connector is excluded from cooling, wherein the device for separation of chalcogens includes an internal cleaning device and has a cylindrical housing to accommodate the cleaning device, and wherein an axis of symmetry of the cylindrical housing is aligned horizontally, and wherein a screw with the shape of an Archimedes spiral with a cutting edge is inserted in the cylindrical housing, the screw having an axis of rotation that also lies on an axis of symmetry of the housing, the input connector is arranged on top on one end of the screw and the outlet connector is arranged on bottom on an other end of the screw, and the cutting edge extends to an inside wall of the housing.

14. Device according to claim 13, wherein the screw is uncooled.

15. Device according to claim 5, wherein the brushes and/or scrapers are arranged in the housing with limited play.

16. Device according to claim 13, wherein the screw is arranged in the housing with limited play.

17. Device for separation of chalcogens from process waste gases from process installation wherein the process installation is connected via a pipeline to an input connector of a device for separation of chalcogens arranged outside of the installation, the pipeline and the input connector have a heat connection to a process chamber of the process installation and/or a heating device, and the device for separation of the chalcogens has an outlet connector and a gas outlet equipped with a cooling device so that the input connector is excluded from cooling, wherein the device for separation of chalcogens includes an internal cleaning device and wherein a screw with a shape of an Archimedes spiral with a cutting edge is inserted in a cylindrical housing of the device for separation of chalcogens, to remove condensed chalcogens from an inner wall of the housing.

18. Device according to claim 17, wherein an axis of rotation of the screw also lies on an axis of symmetry of the housing.

19. Device according to claim 17, wherein the input connector is arranged on top and the outlet connector on bottom of the housing.

20. Device according to claim 17, wherein the input connector is arranged on top on one end of the screw and the outlet connector is arranged on bottom on an other end of the screw.

21. Device according to claim 17, wherein the cutting edge extends to the inside wall of the housing.

22. Device according to claim 17, wherein the screw is uncooled.

23. Device according to claim 17, wherein an axis of symmetry of the cylindrical housing is aligned horizontally.

24. Device according to claim 17, wherein the screw is arranged in the housing with limited play.

* * * * *